United States Patent [19]
Humphreys et al.

[11] Patent Number: 5,155,559
[45] Date of Patent: Oct. 13, 1992

[54] HIGH TEMPERATURE REFRACTORY SILICIDE RECTIFYING CONTACT

[75] Inventors: Trevor P. Humphreys, Raleigh; Robert J. Nemanich, Cary; Kalyankumar Das, Raleigh; Dale G. Thompson, Jr., Chapel Hill; Scott R. Sahaida, Raleigh, all of N.C.

[73] Assignees: North Carolina State University, Raleigh, N.C.; Kobe Steel U.S.A. Inc., New York, N.Y.

[21] Appl. No.: 735,534

[22] Filed: Jul. 25, 1991

[51] Int. Cl.$^5$ .............................. H01L 29/48
[52] U.S. Cl. ........................... 357/15; 357/4; 357/59; 357/67; 423/446; 437/176; 437/178; 437/177; 437/175
[58] Field of Search ............... 357/15, 67 S, 4, 59 I; 423/446; 437/176, 178, 177, 175

[56] References Cited

U.S. PATENT DOCUMENTS

| | | | |
|---|---|---|---|
| 3,188,537 | 8/1965 | Wentorf, Jr. | 317/235 |
| 3,265,944 | 8/1961 | Wentorf, Jr. | 317/236 |
| 3,603,848 | 9/1971 | Tal Sato | 317/235 |
| 4,062,660 | 12/1977 | Nicholas et al. | 51/295 |
| 4,571,447 | 2/1986 | Prins | 136/252 |
| 4,768,011 | 8/1988 | Hattori et al. | 338/5 |
| 4,861,418 | 8/1989 | Nishimura et al. | 156/620.72 |
| 4,940,180 | 7/1990 | Martell | 228/122 |
| 4,951,101 | 8/1990 | Alter et al. | 357/234 |
| 4,982,243 | 1/1991 | Nakahata et al. | 357/15 |
| 5,002,899 | 3/1991 | Geis et al. | 357/15 X |
| 5,006,914 | 4/1991 | Beetz, Jr. | 357/6 |
| 5,034,784 | 7/1991 | Yamazaki | 357/17 |
| 5,087,322 | 2/1992 | Lillienfeld et al. | 357/65 X |

FOREIGN PATENT DOCUMENTS 0343962 5/1988 European Pat. Off. .
0343963 5/1989 European Pat. Off. .

OTHER PUBLICATIONS

Murarka, "Refractory Silicides for Integrated Circuits," *J. Vac. Sci. Technol.*, 17(4), Jul./Aug. 1980, pp. 775–792.

*Primary Examiner*—William Mintel
*Attorney, Agent, or Firm*—Bell, Seltzer, Park & Gibson

[57] ABSTRACT

A semiconductor device comprising a semiconducting diamond layer, (e.g. single crystal or polycrystalline), a refractory metal silicide layer adjacent the diamond layer for forming a rectifying contact therewith, and an annealed interface region between the diamond layer and the refractory metal silicide layer. The annealed interface region is preferably a non-abrupt interface comprising material selected from the group consisting of silicon carbide, the carbide of the refractory metal and mixtures thereof. The present invention also provides a method for making a rectifying contact on a semiconducting diamond layer comprising the steps of forming a refractory metal silicide on the diamond layer, and annealing the refractory metal silicide and diamond layer. Preferably, the step of annealing comprises the step of heating the diamond layer and refractory metal silicide at temperature of at least about 450° C.

13 Claims, 3 Drawing Sheets

HIGH TEMPERATURE REFRACTORY SILICIDE RECTIFYING CONTACT

FIELD OF THE INVENTION

This invention relates to semiconductor devices, and more particularly to a high temperature rectifying contact for semiconductor devices.

BACKGROUND OF THE INVENTION

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. Consequently, the fabrication of metal contacts to diamond will play an important role in the development of future diamond-based devices.

It has been demonstrated previously that gold (Au) or tungsten (W) contacts on a diamond layer provide rectification at temperatures of up to 400° C. Unfortunately, the adhesion of these layers to the diamond, particularly at high temperatures, is often poor. Other rectifying contacts are also known. For example, U.S. Pat. No. 4,982,243 to Nakahata et al. discloses a Schottky rectifying contact which includes a monocrystalline diamond substrate, an epitaxial monocrystalline diamond layer on the substrate, and a metal electrode layer formed on the diamond layer. The diamond layer is epitaxially grown on the surface of the monocrystalline diamond substrate, which surface inclines at an angle of not larger than 10° to the (100) plane. The surface of the substrate is polished to produce the required uniformity of the diamond substrate.

The prior art has been limited to rectifying operation of contacts at relatively low temperatures, and also limited by poor adhesion of the metal contact layer to the diamond at elevated temperatures.

SUMMARY OF THE INVENTION

It is therefore an object of the present invention to provide a stable rectifying contact with improved mechanical adhesion on diamond and which operates at elevated temperatures (e.g., temperatures of about 400° C. and beyond) and a method for making the same.

This and other objects according to the present invention are provided by a rectifying contact comprising a semiconducting diamond layer (e.g., monocrystalline or polycrystalline), a refractory metal silicide layer adjacent to the semiconducting diamond layer for forming a rectifying contact therewith, and an annealed interface region between the semiconducting diamond layer and the refractory metal silicide layer. The annealed interface region is preferably a non-abrupt interface comprising material selected from the group consisting of silicon carbide, the carbide of the refractory metal and mixtures thereof.

The present invention also provides a method for making a rectifying contact on a semiconducting diamond layer comprising the steps of forming a refractory metal silicide on the semiconducting diamond layer, and annealing the refractory metal silicide and diamond layer. Preferably, the step of annealing comprises the step of heating the diamond layer and refractory metal silicide to a temperature of at least about 450° C., often at least about 700° C., and preferably at least about 900° C., and preferably up to about 1200° C., and more preferably up to about 1100° C.

The semiconductor devices of the present invention can be used to replace existing non-diamond rectifying contacts as will be known to those skilled in the art, and particularly used for rectifying contacts which are exposed to elevated temperatures of about 400° C. and beyond.

DETAILED DESCRIPTION OF THE PREFERRED EMBODIMENTS

Figure 1:
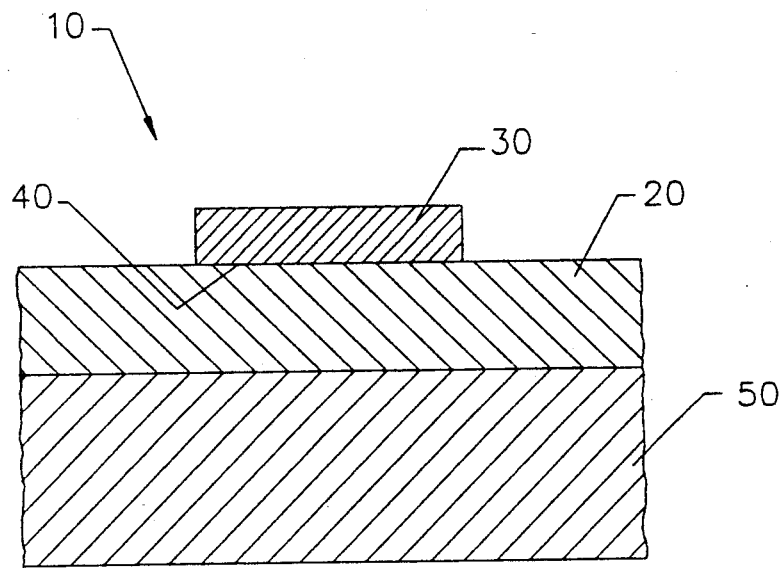
FIG. 1 is a cross-sectional side elevation view of a rectifying contact according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, Applicants provide these embodiments so that this disclosure will be thorough and complete, and will fully convey the scope of the invention to those skilled in the art. In the drawings, the thickness of layers and regions are exaggerated for clarity. Prime notation is used to indicate similar elements.

Referring to FIG. 1 there is shown a semiconductor device 10 according to the present invention. The semiconductor device 10 comprises a semiconducting diamond layer 20, a refractory metal silicide layer 30 and a non-abrupt interface region 40 between the diamond layer 20 and refractory metal silicide layer 30.

The semiconducting diamond layer 20 may have a thickness of greater than about 100Å, preferably between about 1Å and about 250μm, and most preferably about 1μm to about 250μm. The diamond layer 20 may be deposited on a separate substrate 50 such as diamond, silicon, sapphire, boron nitride and the like. Exemplary monocrystalline diamond sources are natural diamond and synthetic diamond formed under high pressure and high temperature. An exemplary polycrystalline diamond source is formed using a conventional chemical vapor deposition (CVD) technique.

Figure 2:
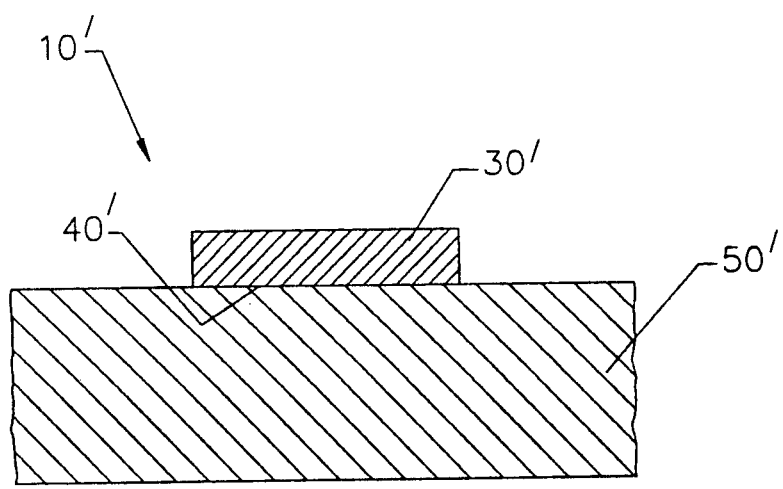
FIG. 2 is a cross-sectional side elevation view of another embodiment of a rectifying contact according to the present invention.

As shown in the alternate embodiment of FIG. 2, the non-rectifying contact 10' may also comprise a semiconducting monocrystalline substrate 50' with a refractory metal silicide layer 30' thereon. A non-abrupt annealed interface region 40' is also formed between the substrate 50' and the metal silicide layer 30'.

The phrase "refractory metal" relates to a metal which exhibits refractory properties, namely a metal characterized by its ability to withstand extremely high temperatures (i.e., temperatures greater than about 1500° C.). Exemplary refractory metals are transition element metals, and preferably are selected from the group consisting of Group IV, V and VI transition element metals (CRC Handbook, 71st Ed.). Exemplary refractory metals include titanium, tantalum, tungsten, molybdenum, hafnium and niobium. Typically, the refractory metal layer 30, 30' has a thickness of greater than about 20Å and preferably between about 500Å and 1μm.

The refractory metal and silicon are co-deposited on the diamond layer 20 or diamond substrate 50' to provide a refractory metal silicide layer 30, 30'. As would be readily understood by those skilled in the art, the co-deposition or deposition may be carried out by molecular beam epitaxy (MBE), sputtering, electron beam evaporation, chemical vapor deposition (CVD), or any method for depositing a layer of refractory metal and silicon or for co-depositing a refractory metal and silicon with thicknesses consistent for the silicide composition. Multiple layers of the refractory metal silicide and the semiconducting layer can be deposited on each other using the above deposition steps. The deposition may be performed on a semiconducting diamond layer 20 or diamond substrate 50' maintained at a temperature of between ambient temperature (i.e., about 25° C. to about 30° C.) and about 1200° C. and preferably at a temperature of at least 450° C. While applicants do not wish to be bound by any theory, it is believed that the higher diamond layer or substrate temperatures facilitates a well-ordered silicide layer and its formation, and improves bonding of the layers together. Additionally, the heating tends to desorb water vapor and gas contaminants from the diamond layer or substrate.

The diamond layer 20 or substrate 50' and the metal silicide layer 30, 30' are then annealed, preferably by thermally annealing the same at a temperature of at least about 450° C., often at least about 700° C. and preferably at least about 900° C., and preferably up to about 1200° C., and more preferably up to about 1100° C. The step of annealing is preferably conducted in a high vacuum, preferably at least about $10^{-6}$ Torr, conducted in an inert atmosphere (e.g., nitrogen, argon, helium, neon, xenon or the like) at between atmospheric pressure and about $10^{-6}$ Torr, or conducted in any non-chemically reactive environment substantially free of impurities. At an annealing temperature of greater than about 1100° C. surface graphitization or carbonization may occur resulting in contacts having undesirable non-rectifying portions. A graphite etch may be used to remove the undesirable graphite portions formed during the annealing step.

The annealed interface region 40, 40' between the semiconducting diamond layer 20 or substrate 50' and the refractory metal silicide layer 30, 30' may typically be a material selected from the group consisting of silicon carbide, the carbide of the refractory metal carbide and mixtures thereof. The annealed interface region provides a non-abrupt interface between the diamond and refractory metal silicide. The term "non-abrupt interface" relates to there being an intermixing or intertwining of the silicon carbide and carbides of refractory metal formed by annealing the diamond and the refractory metal layers. Moreover such intermixing is chemically irreversible.

The examples which follow are provided to further illustrate the present invention and are not to be construed as limiting thereof.

EXAMPLE 1

A D. Drucker & ZN.N.V. monocrystalline low resistivity natural diamond substrate ($\sim 10^4 \Omega$-cm, p-type, (001) orientation) available from Dubbeldee Harris Corp. of Mount Arlington, N.J. is chemically cleaned in a 1:1 bath of sulfuric acid and hydrogen peroxide for about 10 minutes. The monocrystalline diamond substrate is then rinsed with deionized water and dried using filtered nitrogen. The substrate is then mounted on a heater and maintained at a temperature of about 500° C.

Titanium and silicon are co-deposited on the semiconducting diamond substrate. The diamond substrate and titanium silicide thereon is annealed at a temperature of about 1100° C. in a vacuum of about $10^{-6}$ Torr for about 30 minutes.

Figure 3:
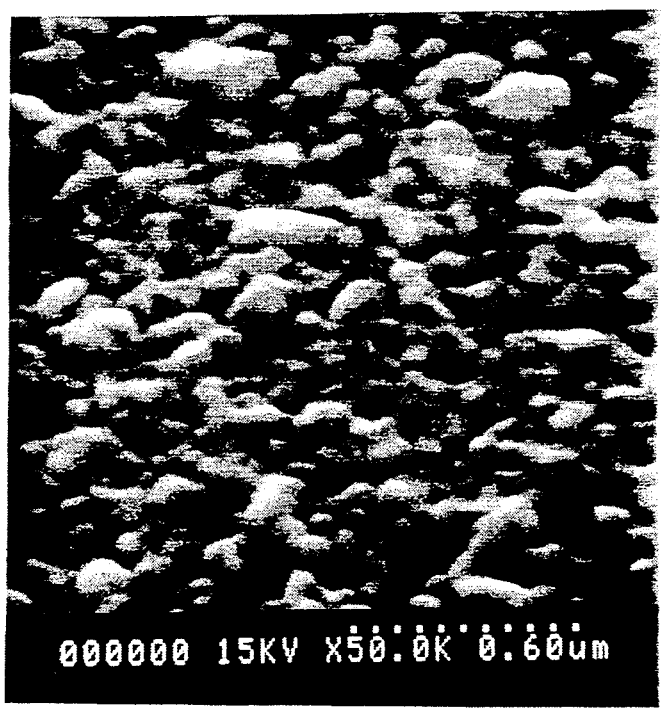
FIG. 3 is a scanning electron micrograph of a rectifying contact provided in accordance with Example 1.

FIG. 3 is a scanning electron micrograph of the resulting semiconductor device having rectifying characteristics.

Figure 4:
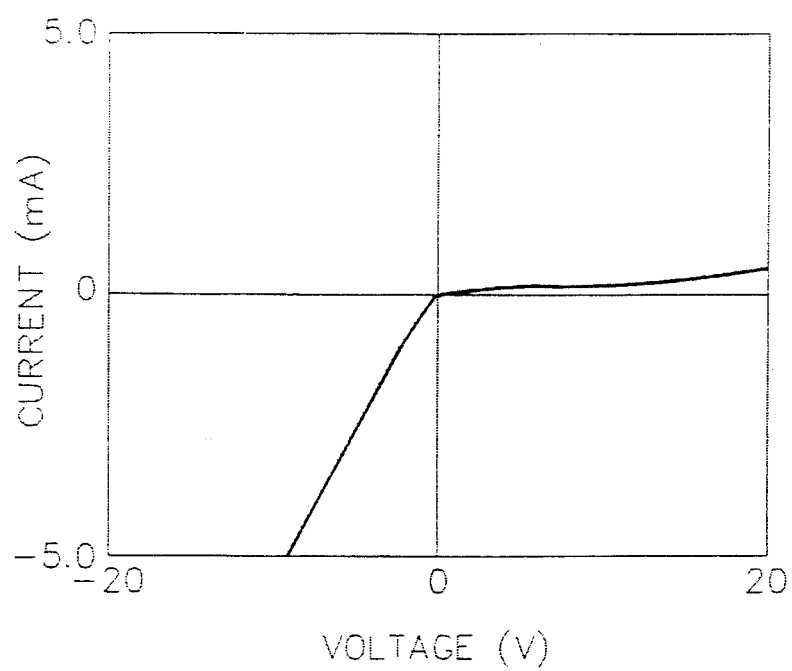
FIG. 4 is a graph indicating the current versus voltage characteristics at 400° C. of the rectifying contact provided in accordance with Example 1.

Current versus voltage (I-V) measurements for the rectifying contact may be obtained using an HP 4135A semiconductor parameter analyzer available from Hewlett-Packard, Palo Alto, California. The diamond substrates may be mounted on a copper plate using silver paint to form a large area back contact. Sample heating in the temperature range between about 25° C. to about 600° C. may be achieved using a ceramic heater assembly. Current versus voltage measurements may be obtained by grounding the copper plate and applying a bias to the refractory metal silicide layer using a tungsten probe. The corresponding I-V characteristics measured at 400° C. are shown in FIG. 4.

EXAMPLE 2

A rectifying contact is formed by co-depositing tantalum and silicon on a semiconducting diamond substrate prepared in the same manner as described in Example 1. Deposition is conducted at ambient temperature. The diamond substrate and tantalum silicide thereon are annealed at 500° C. in an argon atmosphere at ambient pressure for 30 minutes and slowly cooled to ambient temperature.

Figure 5:
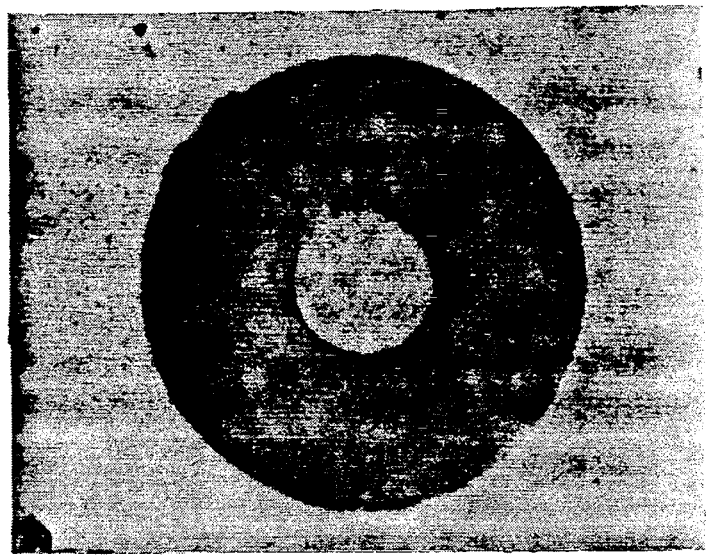
FIG. 5 is an optical micrograph of a rectifying contact provided in accordance with Example 2.

FIG. 5 is an optical micrograph of the resulting semiconductor device having rectifying characteristics.

Figure 6:
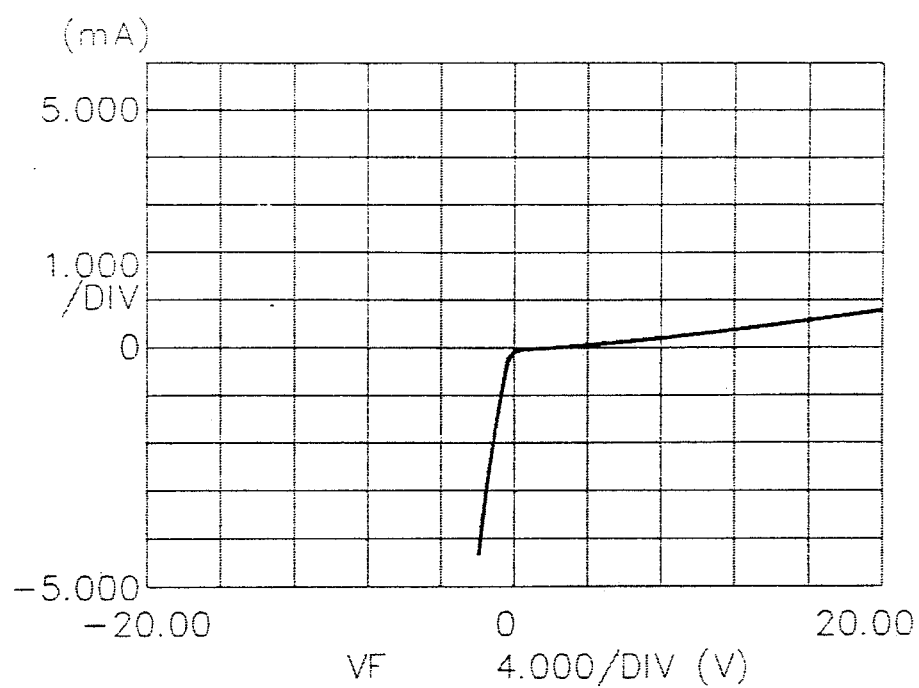
FIG. 6 is a graph indicating the current versus voltage characteristics at 400° C. of the rectifying contact provided in accordance with Example 2.

Current versus voltage (I-V) measurements for the rectifying contact are obtained as described in Example 1. A graph of the I-V measurements is shown in FIG. 6. The graph illustrates that the contact exhibits rectifying characteristics at 400° C.

The semiconductor devices of the Examples and of the invention can be used to replace existing non-diamond rectifying contacts, particularly contacts which are exposed to elevated temperatures of about 400° C. and beyond. Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A semiconductor device comprising:
   a semiconducting diamond layer;
   a refractory metal silicide layer adjacent to said diamond layer for forming a rectifying contact therewith; and
   an annealed interface region between said semiconducting diamond layer and said refractory metal silicide layer.

2. The device according to claim 1 wherein said annealed interface region comprises material selected from the group consisting of silicon carbide, the carbide of the refractory metal of said refractory metal silicide layer, and mixtures thereof.

3. The device according to claim 1 wherein the metal of said refractory metal silicide is selected from the group consisting of Group IV, V and VI transition element metals.

4. The device according to claims 1 or 3 wherein the refractory metal of said refractory metal silicide layer is selected from the group consisting of titanium, tantalum, tungsten, molybdenum, hafnium and niobium.

5. The device according to claim 1 further including a substrate, and wherein said diamond layer is on said substrate.

6. The device according to claim 5 wherein the semiconducting substrate is selected from the group consisting of silicon, diamond, sapphire and boron nitride substrates.

7. The device according to claim 1 wherein the semiconducting diamond layer is formed from one of monocrystalline and polycrystalline diamond.

8. A semiconductor device comprising:
   a monocrystalline semiconducting diamond layer;
   a refractory metal silicide layer adjacent said monocrystalline semiconducting diamond layer for forming a rectifying contact therewith; and
   an annealed interface region between said monocrystalline semiconducting diamond layer and said refractory metal silicide layer.

9. The device according to claim 8 wherein said annealed interface region comprises material selected from the group consisting of silicon carbide, the carbide of said refractory metal of said metal silicide layer, and mixtures thereof.

10. The device according to claim 8 wherein the metal of said refractory metal silicide is selected from the group consisting of Group IV, V and VI transition element metals.

11. The device according to claims 8 or 10 wherein the refractory metal of said refractory metal silicide layer is selected from the group consisting of titanium, tantalum, tungsten, molybdenum, hafnium and niobium.

12. The device according to claim 8 further including a substrate, and wherein said diamond layer is on said substrate.

13. The device according to claim 12 wherein the semiconducting substrate is selected from the group consisting of silicon, diamond, sapphire and boron nitride substrates.

* * * * *